(12) United States Patent
Boneh et al.

(10) Patent No.: US 10,910,850 B2
(45) Date of Patent: Feb. 2, 2021

(54) ENERGY STORAGE APPARATUS

(71) Applicant: NOVA LUMOS LTD., Netanya (IL)

(72) Inventors: Rafael Boneh, Tel Aviv (IL); Nir Marom, Tzur Moshe (IL); David Vortman, Tzur Moshe (IL); Nir Nitzani, Kfar Saba (IL)

(73) Assignee: NOVA LUMOS LTD., Netanya (IL)

( * ) Notice: Subject to any disclaimer, the term of this patent is extended or adjusted under 35 U.S.C. 154(b) by 0 days.

(21) Appl. No.: 16/730,021

(22) Filed: Dec. 30, 2019

(65) Prior Publication Data

US 2020/0136404 A1    Apr. 30, 2020

Related U.S. Application Data

(63) Continuation of application No. 15/583,358, filed on May 1, 2017, now Pat. No. 10,523,046.

(60) Provisional application No. 62/330,174, filed on May 1, 2016.

(51) Int. Cl.
*H02J 7/00*       (2006.01)
*H02S 40/38*      (2014.01)
*H02J 7/35*       (2006.01)
*H01L 31/042*     (2014.01)

(52) U.S. Cl.
CPC .......... *H02J 7/0026* (2013.01); *H01L 31/042* (2013.01); *H02J 7/007* (2013.01); *H02J 7/0029* (2013.01); *H02J 7/0063* (2013.01); *H02J 7/35* (2013.01); *H02S 40/38* (2014.12); *H02J 7/00045* (2020.01); *H02J 2007/0067* (2013.01); *Y02E 10/50* (2013.01)

(58) Field of Classification Search
CPC ..................................................... H02J 7/0029
USPC ......................................................... 320/132
See application file for complete search history.

(56) References Cited

U.S. PATENT DOCUMENTS

| 3,980,996 | A | 9/1976 | Greenspan et al. |
| 8,269,374 | B2 | 9/2012 | De Caires |
| 2005/0182927 | A1 | 8/2005 | Shatford |
| 2014/0184173 | A1 | 7/2014 | Szepesi |
| 2015/0311737 | A1* | 10/2015 | Park ..................... H02J 7/0063 307/125 |
| 2015/0346792 | A1 | 12/2015 | Rathi et al. |
| 2015/0364937 | A1* | 12/2015 | Becerra .................. G06Q 30/06 320/101 |

* cited by examiner

*Primary Examiner* — Edward Tso
*Assistant Examiner* — Ahmed H Omar
(74) *Attorney, Agent, or Firm* — The Roy Gross Law Firm, LLC; Roy Gross

(57) ABSTRACT

An energy storage apparatus. The energy storage apparatus includes an energy storage, wherein the energy storage is connected to at least one energy source, wherein the energy storage is configured to store energy from the at least one energy source; a power supplier, wherein the power supplier is connected to an external load, wherein the power supplier is configured to provide energy from the energy storage to the external load; and a distribution regulator, wherein the distribution regulator is configured, in real-time, to operate the energy storage apparatus in a reduced power mode.

10 Claims, 4 Drawing Sheets

ENERGY STORAGE APPARATUS

CROSS-REFERENCE TO RELATED APPLICATIONS

This application is a continuation of U.S. patent application Ser. No. 15/583,358, filed May 1, 2017, which claims the benefit of priority of U.S. Provisional Patent Application No. 62/330,174, filed May 1, 2016, the contents of which are hereby incorporated by reference in their entirety.

TECHNICAL FIELD

The present disclosure relates generally to energy storage, and more particularly to controlled distribution of energy from an energy storage.

BACKGROUND

Approximately 1.5 billion people around the world do not have access to grid electricity. An additional 1 billion are connected to unreliable grids. Many such people live in developing countries where lack of suitable infrastructure prevents access to reliable grids. Even though these people are often poor, they pay far more for lighting than people in many other countries because they use inefficient energy sources (such as kerosene) that are far costlier than grid electricity or environmentally-produced energy. Renewable energy, and in particular energy generated by solar photovoltaic panels, can be particularly suitable for developing countries since transmission and distribution of energy generated from fossil fuels can be difficult and expensive in such countries.

Some existing solutions for providing energy allow users to install solar powered energy storage units, for example in their homes. However, such units typically have high upfront costs and, as such, may be prohibitively expensive for customers. As a result, creative business models for providing "pay-as-you-go" electricity on demand have been developed, allowing businesses to cover the cost of solar panels and accompanying energy storage units.

Thus, although the case for renewable energy in developing countries is compelling, there remains a problem of how to finance deployment of renewable energy systems such as photovoltaic panels in areas where the population cannot afford to purchase such systems or finance the costs typically associated with deployment of such systems, and especially when such systems are prone to theft or bypassing of payment requirements.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include an energy storage apparatus for an energy storage, wherein the energy storage is connected to at least one energy source, wherein the energy storage is configured to store energy from the at least one energy source; a power supplier, wherein the power supplier is connected to an external load, wherein the power supplier is configured to provide energy from the energy storage to the external load; and a distribution regulator, wherein the distribution regulator is configured, in real-time, to operate the energy storage apparatus in a reduced power mode.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
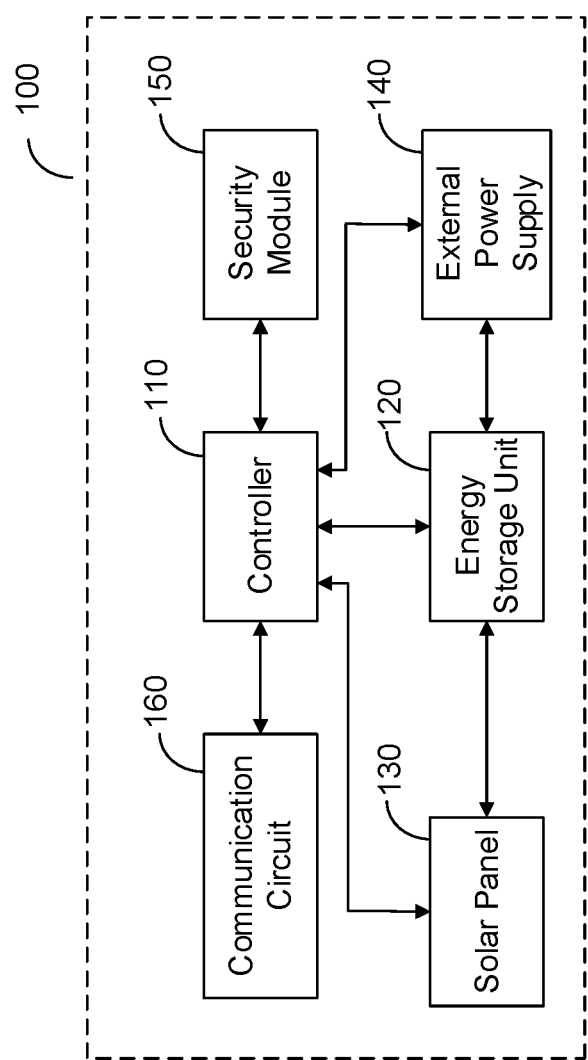
FIG. 1 is a schematic diagram of an energy storage apparatus according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include an energy storage apparatus. The energy storage apparatus includes an energy storage connected to at least one energy source, a power supplier for providing electricity to an external load, and a distribution regulator connected to the power supplier. The distribution regulator is configured to cause the energy storage apparatus to enter a reduced power mode upon detection of an unauthorized access event. The distribution regulator may further be configured to determine or receive an amount or rate of energy to be delivered in the reduced power mode. The distribution regulator may be further configured to cause the energy storage apparatus to switch from the reduced power mode to a normal power mode upon detection of an authorization event.

FIG. 1 shows an example schematic diagram of an energy storage apparatus 100 according to an embodiment. The energy storage apparatus 100 includes a distribution regulator 110 communicatively connected to an energy storage 120, an energy source 130, a power supplier 140, a security manager 150, and a communication circuit 160. The components of the energy storage apparatus 100 can be integrated into a single housing, or can be separately housed and interconnected via wires or wirelessly. An example schematic diagram for the distribution regulator 110 is described further herein below with respect to FIG. 4.

In an embodiment, the energy storage 120 is connected to the energy source 130 and to the power supplier 140. The energy storage 120 stores energy generated by the energy source 130, and the power supplier 140 obtains energy stored in the energy storage 120 for delivery to one or more energy provisioning devices (not shown). In an embodiment, the energy storage 120 may include or be connected to a power manager (not shown) for controlling charging or discharging of energy to or from the energy storage 120.

In an embodiment, the energy source 130 may generate renewable energy based on environmental energy sources such as, but not limited to, the sun (i.e., solar energy), water (e.g., hydroelectric or wave generators), wind, and the earth (i.e., geothermal energy). To this end, in a further embodiment, the energy source 130 may be or may include at least one solar panel, at least one photovoltaic panel, a hydroelectric generator, a wave generator, a wind turbine, and the like.

In an embodiment, the security manager 150 may be configured to detect unauthorized access events related to the energy storage apparatus 100. Unauthorized access events may include attempts to, for example but not limited to, bypass the distribution regulator 110 while accessing the energy provisioning devices, access the energy storage 120 directly, obtain energy from the energy storage apparatus 100 while failing to comply with at least one access rule, and the like.

In an embodiment, the security manager 150 may be configured to detect unauthorized access events based on at least one access rule. The at least one access rule may be based on, but is not limited to, requiring a minimum payment for a period of time, requiring sufficient remaining funds (e.g., when access is based on payment per unit of energy consumed), forbidding bypass attempts, and the like. In a further embodiment, the security manager 150 is configured to receive a security token and to determine whether the at least one access rule is met based on the token. To this end, the token may indicate, but is not limited to, that payment was made, a duration of time for which the payment is valid, an amount of energy that may be utilized after the payment, a combination thereof and the like. As a non-limiting example, it may be determined whether the token indicates sufficient payment and whether the payment has expired (either due to passage of time or consumption of energy). The token may be received periodically (e.g., at predetermined time intervals), upon detecting an access attempt (e.g., by sending a request for a token), and the like.

In an embodiment, the security manager 150 may include or be communicatively connected to at least one sensor (not shown) such as, but not limited to, motion sensors, trip sensors, accelerometers, and the like, and unauthorized access events may be detected when bypass attempts are made as determined based on sensor signals from the at least one sensor. For example, an unauthorized access event may be detected when a sensor utilized to monitor a connection between the power supplier 140 and the energy storage 120 is tripped (i.e., when movement that may be related to bypassing the power supplier 140 and accessing the energy storage 120 directly is detected).

In an embodiment, upon detecting an unauthorized access attempt, the security manager 150 is configured to send, in real-time, a notification to the distribution regulator 110. In a further embodiment, the distribution regulator 110 is configured to cause the energy storage apparatus 100 to enter a reduced power mode upon receiving a notification indicating the unauthorized access attempt. To this end, in an embodiment, the distribution regulator 110 may be configured to, e.g., reconfigure the energy storage 120 to charge at most up to a reduced charging level, configure the power supplier 140 to discharge at most down to a reduced discharging level, reconfigure the energy storage 120 to charge an amount of power within a range of allowed charges, or a combination thereof. In a further embodiment, the distribution regulator 110 may be configured to determine the reduced power mode from among a plurality of reduced power modes allowing for different levels of charge, discharge, or both. In yet a further embodiment, the distribution regulator 110 may be configured to determine the reduced charging level, the reduced discharging level, the range, or a combination thereof. In another embodiment, the distribution regulator 110 may be configured to obtain the reduced charging level, the reduced discharging level, the range, or a combination thereof from, for example, a remote server (not shown).

In an example implementation, the reduced power mode may be a "trickle" power mode such that, in the trickle power mode, the energy storage apparatus 100 stores only the minimum amount of power required to, e.g., maintain at least one basic function of the energy storage apparatus 100. For example, in the trickle power mode, the energy storage 120 may not discharge below a minimum threshold charge, where a battery of the energy storage 120 would be damaged if the charge of the energy storage 120 decreased below the minimum threshold charge. In some example implementations, no power or a minimal amount of power (e.g., an amount below a predetermined threshold) may be supplied by the power supplier 140 when in the trickle power mode.

In an embodiment, the distribution regulator 110 may be configured to switch, in real-time, to a normal power mode when it is determined that the unauthorized access event is over. The normal power mode may be a full or otherwise highest power mode in which the distribution regulator 110 does not restrict charging or discharging. In a further embodiment, the security manager 150 may be configured to determine whether the unauthorized access attempt is over and, if so, to send a notification indicating that access is reauthorized to the distribution regulator 110. The unauthorized access attempt may be determined to be ended when, for example, sufficient payment has been made, when sensor signals no longer indicate a bypass attempt, and the like.

It should be noted that the energy storage apparatus 100 may switch between more than two modes without departing from the scope of the disclosure. As a non-limiting example, the energy storage apparatus 100 may switch among a first reduced power mode, a second reduced power mode, and a normal power mode, where the first reduced power mode is a "trickle" power mode in which only the minimum amount of charge needed for basic functions is stored in the energy storage 120 and no power is supplied to external devices by the power supplier 140, the normal power mode is a full power mode with no restrictions on charging or discharging imposed by the distribution regulator, and the second reduced power mode is a mode in which more (but not full) power may be charged and discharged than in the trickle power mode. The distribution regulator 110 may be configured to enter different modes based on different sets of unauthorized access rules. As a non-limiting example, the first reduced power mode (i.e., the "trickle" mode) may be entered when a bypass attempt is detected, and the second reduced power mode may be entered when only a partial payment has been received.

The communication circuit 160 is configured to enable communications between the energy storage apparatus 100 and, for example, a network (e.g., a cellular network). The communications may be utilized for purposes such as, but not limited to, receiving secure tokens, receiving sensor data, obtaining threshold levels and ranges for charging and discharging, and the like.

Figure 2:
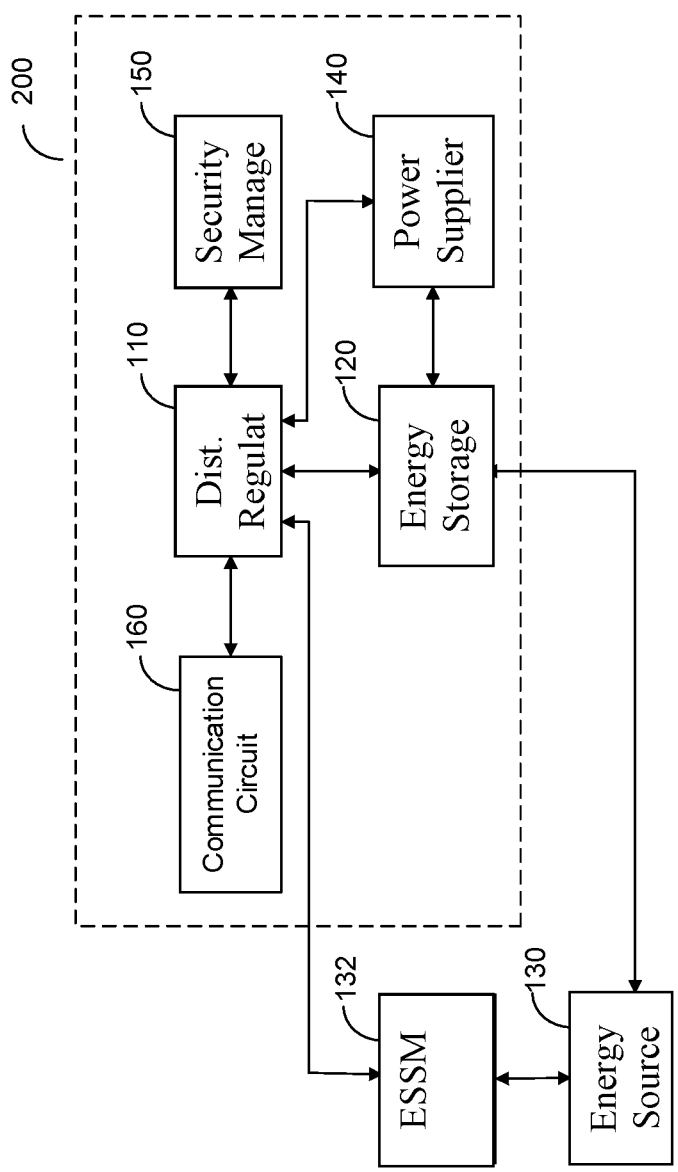
FIG. 2 is a schematic diagram of an energy storage apparatus according to another embodiment.

FIG. 2 is an example schematic diagram of an energy storage apparatus 200 according to another embodiment. The energy storage apparatus 200 includes a distribution regulator 110 communicatively connected to an energy storage 120, a power supplier 140, a security manager 150, and a communication circuit 160. The distribution regulator 110, the energy storage 120, the power supplier 140, the security manager 150, and the communication circuit 160 may generally operate as described herein above with respect to FIG. 1. The distribution regulator 110 is further communicatively connected to an external energy source security manager (ESSM) 132.

In some embodiments, the energy storage apparatus 200 may include a power manager (not shown) for providing charge from the energy source 130 to the energy storage 120 and for providing charge from the energy storage 120 to the power supplier 140.

The energy storage 120 is connected to an external energy source 130, which is connected to the ESSM 132. The ESSM 132 may include at least one security device such as, but not limited to, an anti-tamper device. The ESSM 132 may be further configured to detect bypass attempts related to the energy source 130 such as, but not limited to, attempts to bypass the power manager 110, attempts to access the energy source 130 directly, and the like. In an embodiment, the distribution regulator 110 is configured to receive notifications generated by the ESSM 132 indicating bypass attempts and to detect, based on the received notifications, unauthorized access attempts.

Figure 3:
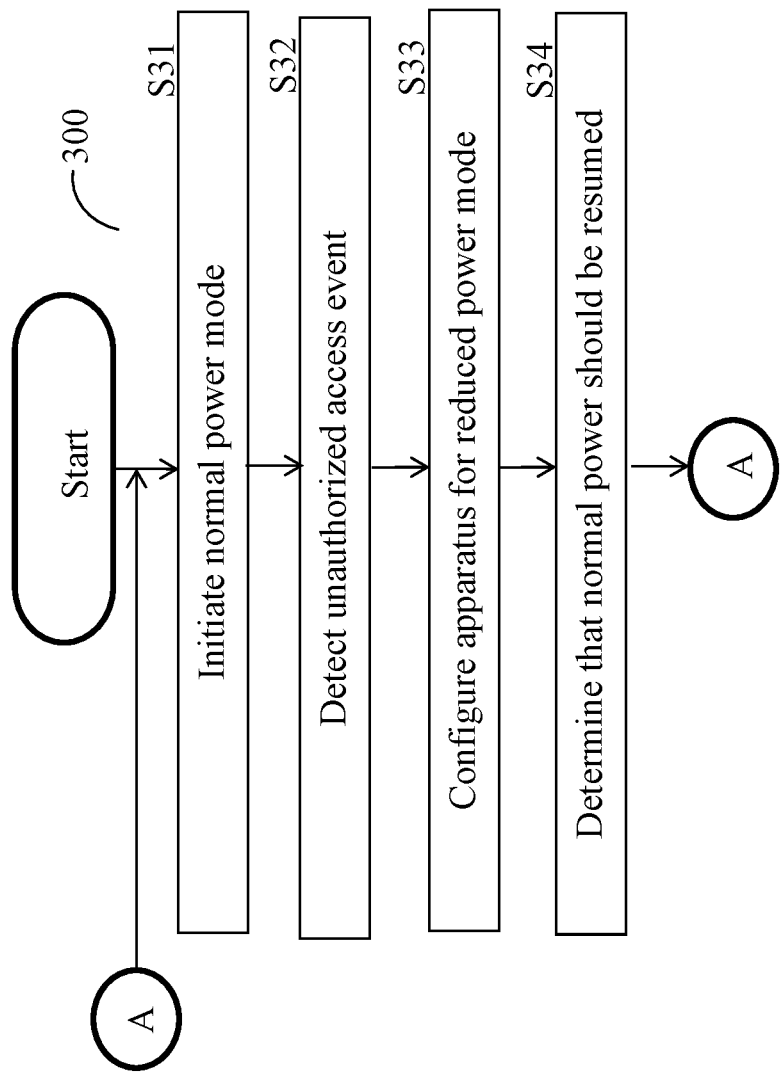
FIG. 3 is a flowchart illustrating a method for controlling access from an energy storage apparatus according to an embodiment.

FIG. 3 is an example flowchart 300 illustrating a method for controlling energy distribution of an energy storage apparatus according to an embodiment. In an embodiment, the method is performed by the distribution regulator 110 with respect to an energy storage apparatus such as, for example, the energy storage apparatus 100 or the energy storage apparatus 200.

At S310, a normal power mode is initiated. The normal power mode may be a full power or otherwise highest power mode. In an embodiment, the normal power mode may have a normal charging threshold and a normal discharging threshold, where an energy storage of the energy storage apparatus is not charged above the normal charge threshold and is not discharged below the normal discharged threshold. In an embodiment, S310 includes configuring an energy storage to charge at most to the normal charging threshold, configuring a power supplier to discharge energy in the energy storage at most to the normal discharging threshold, or both.

At S320, an unauthorized access event is detected. The unauthorized access event may be, but is not limited to, a malfunction in the energy storage apparatus, an unauthorized tampering (or attempt thereof), a power level below a predetermined threshold, or a failure to pay. In an embodiment, the unauthorized access event is detected based on at least one access rule. In a further embodiment, the unauthorized access event is detected with respect to at least one of: at least one sensor signal received from at least one sensor deployed in proximity to the energy storage apparatus or a portion thereof, and at least one security token. The sensor signals may indicate the presence or absence of entities near an energy storage or a power supplier of the energy storage apparatus, whether energy is being diverted from the energy storage apparatus, or both. The security tokens may indicate whether energy consumption is authorized, a limit on energy authorization (e.g., for a period of time or allowing an amount of energy to be consumed before authorization is revoked), or both.

At S330, upon detection of the unauthorized access event, the energy storage apparatus is configured, in real-time, to operate in a reduced power mode. In an embodiment, S330 includes configuring the energy storage to charge at most to a reduced charging threshold, configuring the power supplier to discharge energy in the energy storage at most to a reduced discharging threshold, or both.

In an embodiment, S330 may include determining the reduced charging threshold, the reduced discharging threshold, or both. The thresholds may be determined based on, but not limited to, a type of the unauthorized access event. As a non-limiting example, a first set of thresholds allowing no charging or discharging is determined for a malfunction in the energy storage apparatus, and a second set of thresholds allowing for an amount of charging required for maintaining a battery of the energy storage (i.e., a trickle mode) is determined for a payment failure. Alternatively, the thresholds may be received from, e.g., a remote server.

At S340, when the unauthorized access event is ended, it is determined that the normal power mode should resume and execution continues with S310. The unauthorized access event may be ended when, for example, the energy storage apparatus is no longer malfunctioning, when the tampering has ceased, when sufficient payment has been made, and the like. To this end, S340 may include continuously determining whether the at least one access rule has been met based on updated data including sensor signals, security tokens, or both.

Figure 4:
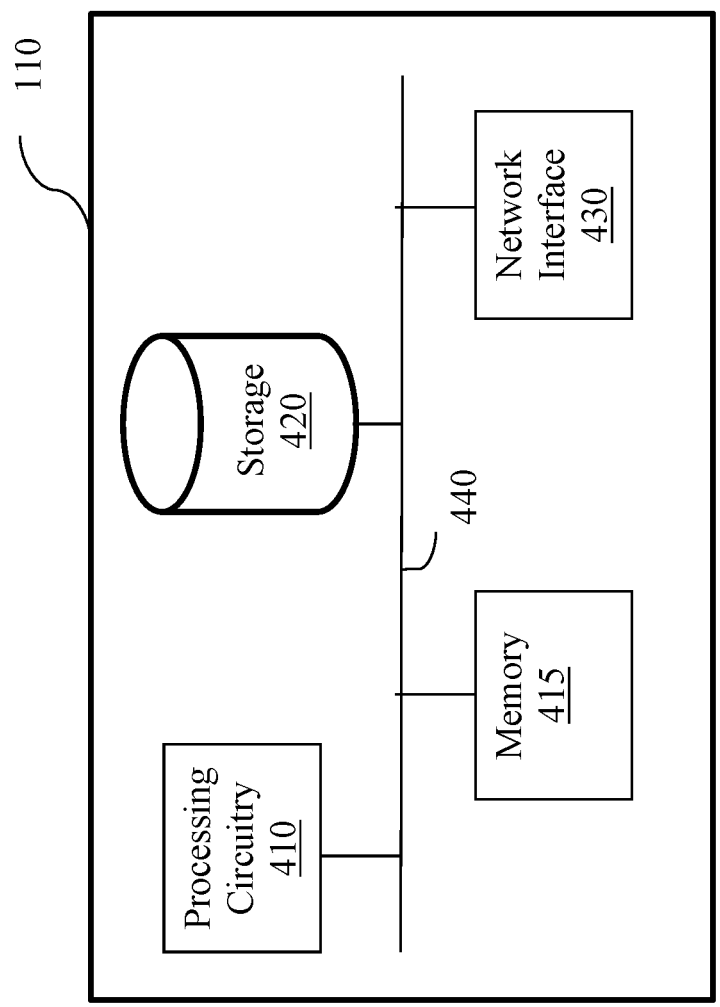
FIG. 4 is a schematic diagram of a distribution regulator according to an embodiment.

FIG. 4 is an example schematic diagram of the distribution regulator 110 according to an embodiment. The distribution regulator 110 includes a processing circuitry 410 coupled to a memory 415, a storage 420, and an interface 430. In an embodiment, the components of the distribution regulator 110 may be communicatively connected via a bus 440.

The processing circuitry 410 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

The memory 415 may be volatile (e.g., RAM, etc.), non-volatile (e.g., ROM, flash memory, etc.), or a combination thereof. In one configuration, computer readable instructions to implement one or more embodiments disclosed herein may be stored in the storage 420.

In another embodiment, the memory 415 is configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing circuitry 410 to perform the various processes described herein. Specifically, the instructions, when executed, cause the processing circuitry 410 to perform an on-demand authorization of access to protected resources, as discussed hereinabove.

The storage 420 may be magnetic storage, optical storage, and the like, and may be realized, for example, as flash memory or other memory technology, CD-ROM, Digital Versatile Disks (DVDs), or any other medium which can be used to store the desired information.

The interface 430 allows the distribution regulator 110 to communicate with the energy storage 120, the energy source 130, the power supplier 140, the security manager 150, the communication circuit 160, or a combination thereof, for the purpose of, for example, causing the power supplier 140 to changes modes, determining mode-changing events, determining power levels for reduced power modes, and the like It should be understood that the embodiments described herein are not limited to the specific architecture illustrated in FIG. 4, and other architectures may be equally used without departing from the scope of the disclosed embodiments.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a nontransitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

What is claimed is:

1. An energy storage apparatus, comprising:
an energy storage connected to at least one energy source, wherein the energy storage is configured to store energy from the at least one energy source; and
a distribution regulator configured to control (i) providing charge from said energy source to said energy storage and (ii) an energy supply level from said energy storage, based on one of a plurality of power modes;
wherein said distribution regulator selects one of said plurality of power modes in response to detecting an unauthorized access attempt to said energy storage, and
wherein, in each of said plurality of power modes, said charge from said energy source does not decrease below a minimum level.

2. The energy storage apparatus of claim 1, wherein each of said power modes is further associated with at least one of a charge level and a discharge level of said energy storage.

3. The energy storage apparatus of claim 1, wherein said power modes are selected from the group consisting of: full power level, reduced power level, and trickle power level.

4. The energy storage apparatus of claim 1, wherein the at least one energy source is at least one solar panel, and wherein the energy stored in the energy storage is solar power.

5. The energy storage apparatus of claim 1, wherein said energy source is at least one of: a fossil fuel power source, a solar energy power source, a hydroelectric power source, a wave generator power source, a wind-based power source, and a geothermal power source.

6. A method for managing an energy storage apparatus, the method comprising:
providing an energy storage apparatus comprising:
an energy storage connected to at least one energy source, wherein the energy storage is configured to store energy from the at least one energy source, and
a distribution regulator configured to control (i) providing charge from said energy source to said stored energy and (ii) an energy supply level from said energy storage, based on one of a plurality of power modes, wherein said distribution regulator selects one of said plurality of power modes in response to detecting an unauthorized access attempt to said energy storage, and wherein, in each of said plurality of power modes, said charge from said energy source does not decrease below a minimum level;
detecting an unauthorized access attempt to said energy storage; and
selecting, by said distribution regulator, one of said plurality of power modes, in response to said detecting.

7. The method of claim 6, wherein each of said power modes is further associated with at least one of a charge level and a discharge level of said energy storage.

8. The method of claim 6, wherein said power modes are selected from the group consisting of: full power level, reduced power level, and trickle power level.

9. The method of claim 6, wherein the at least one energy source is at least one solar panel, and wherein the energy stored in the energy storage is solar power.

10. The method of claim 6, wherein said energy source is at least one of: a fossil fuel power source, a solar energy power source, a hydroelectric power source, a wave generator power source, a wind-based power source, and a geothermal power source.

* * * * *